(12) United States Patent
Chen et al.

(10) Patent No.: US 11,044,817 B2
(45) Date of Patent: Jun. 22, 2021

(54) THERMALLY CONDUCTIVE BOARD

(71) Applicant: Polytronics Technology Corp., Hsinchu (TW)

(72) Inventors: Kuo-Hsun Chen, Toufen (TW); Chia-Hsiung Wu, Miaoli County (TW); Kai-Wei Lo, Taipei (TW); Yu-Hsuan Tseng, Miaoli County (TW)

(73) Assignee: POLYTRONICS TECHNOLOGY CORP., Hsinchu (TW)

( * ) Notice: Subject to any disclaimer, the term of this patent is extended or adjusted under 35 U.S.C. 154(b) by 0 days.

(21) Appl. No.: 16/844,566

(22) Filed: Apr. 9, 2020

(65) Prior Publication Data

US 2021/0059056 A1 Feb. 25, 2021

(30) Foreign Application Priority Data

Aug. 22, 2019 (TW) ................. 108130094

(51) Int. Cl.
*H05K 1/02* (2006.01)
*H05K 1/03* (2006.01)
*H05K 1/11* (2006.01)
*H05K 3/00* (2006.01)
*H05K 3/02* (2006.01)
*H05K 3/06* (2006.01)
(Continued)

(52) U.S. Cl.
CPC ............... *H05K 3/06* (2013.01); *H05K 3/26* (2013.01); *H05K 2201/0338* (2013.01); *H05K 2201/0761* (2013.01); *H05K 2203/063* (2013.01)

(58) Field of Classification Search
CPC ... H05K 1/02; H05K 1/03; H05K 1/11; H05K 3/00; H05K 3/02; H05K 3/06; H05K 3/10; H05K 3/20; H05K 3/38; H05K 3/46; H01M 4/04; H01M 4/48; H01M 4/50; H01M 4/52; H01M 4/54; H01M 4/58; H01M 4/62; H01M 4/66; H01M 4/485
USPC ........... 361/748; 428/209, 307.3, 319.1, 446, 428/458, 607, 626, 674, 675, 687, 901; 429/105, 219, 220, 231, 245, 246, 326, 429/341, 402; 438/411, 455, 458
See application file for complete search history.

(56) References Cited

U.S. PATENT DOCUMENTS 5,686,172 A * 11/1997 Ohya .................. H01L 21/4846
156/89.28
5,925,451 A * 7/1999 Ohya .................. C04B 41/4853
428/307.3
(Continued)

FOREIGN PATENT DOCUMENTS

CN 205124230 U 3/2016
TW 200812025 A 3/2008

*Primary Examiner* — Xiaoliang Chen
(74) *Attorney, Agent, or Firm* — Muncy, Geissler, Olds & Lowe, P.C.

(57) ABSTRACT

A thermally conductive board comprises a metal substrate, a foil containing copper, a thermally conductive and insulating layer and a barrier layer. The thermally conductive and electrically insulating layer is disposed on the metal substrate. The barrier layer is laminated between the foil containing copper and the thermally conductive and electrically insulating layer. The barrier is in direct contact with the foil containing copper, and the interface between the barrier layer and the foil containing copper comprises a microrough surface. The barrier layer has a Redox potential between 0 and −1V. The microrough surface has a roughness Rz of 2-18 μm.

12 Claims, 2 Drawing Sheets

(51) Int. Cl.
*H05K 3/10* (2006.01)
*H05K 3/20* (2006.01)
*H05K 3/38* (2006.01)
*H05K 3/46* (2006.01)
*H01M 4/04* (2006.01)
*H01M 4/48* (2010.01)
*H01M 4/50* (2010.01)
*H01M 4/52* (2010.01)
*H01M 4/54* (2006.01)
*H01M 4/58* (2010.01)
*H01M 4/62* (2006.01)
*H01M 4/66* (2006.01)
*H01M 4/485* (2010.01)
*H05K 3/26* (2006.01)

(56) References Cited

U.S. PATENT DOCUMENTS

| | | | | |
|---|---|---|---|---|
| 7,175,920 B2* | 2/2007 | Suzuki | | B32B 15/08 |
| | | | | 205/152 |
| 7,651,783 B2* | 1/2010 | Tsuchida | | C23C 28/00 |
| | | | | 428/626 |
| 9,147,812 B2* | 9/2015 | Andrews | | H01L 33/48 |
| 2003/0049913 A1* | 3/2003 | Gaku | | H05K 3/108 |
| | | | | 438/411 |
| 2003/0148136 A1* | 8/2003 | Yamamoto | | H05K 3/384 |
| | | | | 428/607 |
| 2004/0191491 A1* | 9/2004 | Sugaya | | H05K 3/382 |
| | | | | 428/209 |
| 2005/0079417 A1* | 4/2005 | Kim | | H01M 4/5825 |
| | | | | 429/231.2 |
| 2006/0127773 A1* | 6/2006 | Kawakami | | H01M 4/622 |
| | | | | 429/245 |
| 2007/0093035 A1* | 4/2007 | Daigle | | H05K 3/38 |
| | | | | 438/455 |
| 2007/0148421 A1* | 6/2007 | Sohn | | B32B 7/04 |
| | | | | 428/209 |
| 2008/0145758 A1* | 6/2008 | Kim | | H01M 10/0525 |
| | | | | 429/219 |
| 2008/0233478 A1* | 9/2008 | Hirose | | H01M 4/131 |
| | | | | 429/220 |
| 2011/0294020 A1* | 12/2011 | Kim | | H01M 4/485 |
| | | | | 429/341 |
| 2014/0110153 A1* | 4/2014 | Kashiwagi | | C22C 30/02 |
| | | | | 174/251 |
| 2015/0194717 A1* | 7/2015 | Mizuno | | H01M 4/381 |
| | | | | 60/299 |
| 2015/0203378 A1* | 7/2015 | Steffen | | C02F 1/46104 |
| | | | | 99/284 |
| 2016/0056412 A1* | 2/2016 | Hirosawa | | H01L 51/5253 |
| | | | | 257/40 |
| 2017/0207415 A1* | 7/2017 | Ii | | H01L 51/5253 |
| 2017/0231088 A1* | 8/2017 | Akatuka | | B32B 27/12 |
| 2018/0297329 A1* | 10/2018 | Kitai | | B32B 5/02 |
| 2019/0030870 A1* | 1/2019 | Terada | | B32B 7/12 |
| 2020/0384530 A1* | 12/2020 | Sethi | | B22F 1/007 |

* cited by examiner

THERMALLY CONDUCTIVE BOARD

BACKGROUND OF THE INVENTION

(1) Field of the Invention

The present application relates to a thermally conductive board, and more specifically, to a thermally conductive board capable of preventing copper ionic migration to obtain superior voltage endurance.

(2) Description of the Related Art

Ionic migration is that metals such as copper or silver on a circuit board may be ionized at a certain condition and the ions go to an electrode through an insulating layer to degrade insulation. Because there are wide line gaps on earlier circuit boards, the insulation issue is not often seen. The issue only occurs in high-temperature and high-humidity environment, and therefore it does not draw attention.

When a direct current (DC) electric field exists between two metal layers at two sides of an insulator, the two metal layers become two electrodes in which one electrode serving as anode is ionized and ions are affected by the electric field to migrate to another electrode serving as cathode through the insulator. As such, the insulator loses insulation characteristic and becomes ionic conductive, causing short-circuit. Ionic migration occurs in humid environment and the insulator has materials on surface or interior tending to generate electrolyte. The factors of insulator which may cause ionic migration include category, composition, fiber characteristic and resin characteristic.

A know thermally conductive board is a laminate of a metal substrate, a thermally conductive and electrically insulating layer and a copper foil. During High temperature and High humidity Biased Test (HHBT), ion migration may occur on the copper foil to reduce insulation effect of the insulating layer, and therefore deteriorating voltage endurance and anti-aging capabilities.

SUMMARY OF THE INVENTION

The present application provides a thermally conductive board in which an electrode foil, e.g., a foil containing copper, is disposed by a barrier layer such as a nickel layer or another metal layer to avoid malfunction of the thermally conductive board due to copper ionic migration of the foil containing copper in high-temperature and high-humidity environment, thereby enhancing HHBT voltage endurance.

In accordance with an embodiment of the present application, a thermally conductive board comprises a metal substrate, a foil containing copper, a thermally conductive and electrically insulating layer and a barrier layer. The thermally conductive and electrically insulating layer is disposed on the metal substrate. The barrier layer is laminated between the foil containing copper and the thermally conductive and electrically insulating layer. The barrier is in direct contact with the foil containing copper, and the interface between the barrier layer and the foil containing copper comprises a microrough surface. The barrier layer has a Redox potential between 0 and −1V. The microrough surface has a roughness Rz of 2-18 μm.

In an embodiment, Redox potential difference between the barrier layer and the copper is 0.5-1.2V.

In an embodiment, the barrier layer comprises a metal layer, nodules or combination thereof.

In an embodiment, the nodules have a thickness of 0.5-12 μm.

In an embodiment, the barrier layer is 1-50% of the foil containing copper in thickness.

In an embodiment, the barrier layer has a thickness of 0.5-10 μm.

In an embodiment, the barrier layer comprises nickel, tin, zinc, chromium, bismuth, cobalt or combination thereof.

In an embodiment, the roughness Rz of the microrough surface divided by the thickness of the foil containing copper is 15-50%.

In an embodiment, the microrough surface is coated with hydrophobic modifier.

In an embodiment, the thermally conductive board has peeling strength greater than or equal to 1 kg/cm.

In an embodiment, alternating current (AC) voltage endurance of the thermally conductive board is greater than 50% of AC voltage endurance of the thermally conductive and electrically insulating layer.

In an embodiment, the thermally conductive and electrically insulating layer has a thickness of 50-300 μm.

The thermally conductive board of the present application prevents copper ionic migration to improve anti-oxidation and resolve the HHBT issue. As a result, the electronic apparatuses using the thermally conductive boards obtains superior voltage endurance and anti-aging capabilities.

BRIEF DESCRIPTION OF THE DRAWINGS

The present application will be described according to the appended drawings in which.

DETAILED DESCRIPTION OF THE INVENTION

The making and using of the presently preferred illustrative embodiments are discussed in detail below. It should be appreciated, however, that the present application provides many applicable inventive concepts that can be embodied in a wide variety of specific contexts. The specific illustrative embodiments discussed are merely illustrative of specific ways to make and use the invention, and do not limit the scope of the invention.

Figure 1:
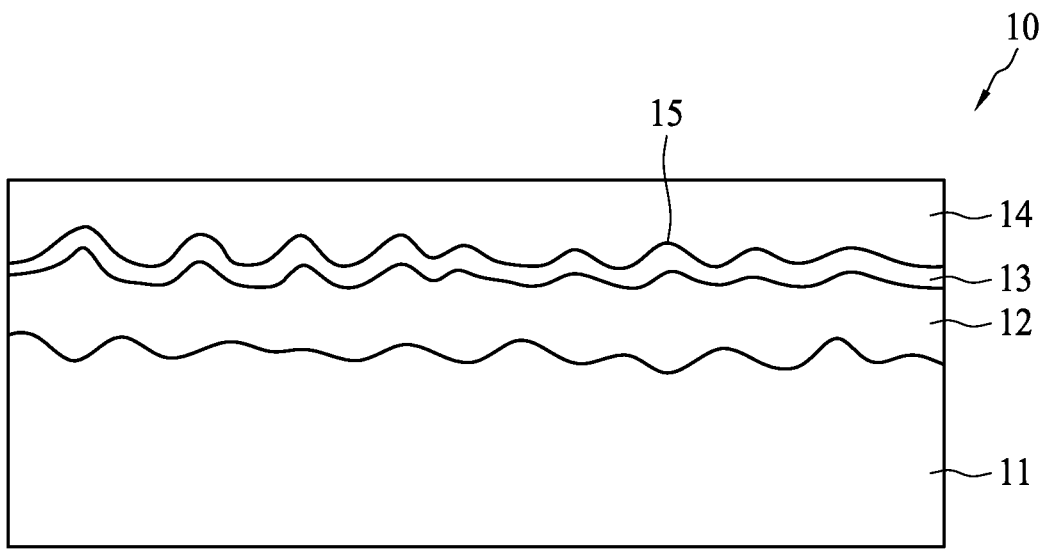
FIG. 1 shows a thermally conductive board in accordance with an embodiment of the present application.

FIG. 1 shows a thermally conductive board in accordance with an embodiment of the present application. A thermally conductive board 10 comprises a metal substrate 11, a thermally conductive and electrically insulating layer 12, a barrier layer 13 and a foil containing copper 14. The thermally conductive and electrically insulating layer 12 is disposed on the metal substrate 11, and the barrier layer 13 is laminated between the foil containing copper 14 and the thermally conductive and electrically insulating layer 12. The barrier layer 13 is in direct contact with the foil containing copper 14. An interface between the barrier layer 13 and the foil containing copper 14 comprises a microrough surface 15 with a roughness Rz of 2-18 μm, e.g., 5 μm, 10 μm or 15 μm, to increase bonding strength of the foil containing copper 14 and the thermally conductive and electrically insulating layer 12.

The barrier layer 13 is used for suppressing copper ionic migration of the foil containing copper 14. A metal with a larger Redox potential is easily oxidized. In contrast, a metal with a small Redox potential is reduced easily. Copper can be ionized as follows: Cu→Cu⁺+e⁻, and the Redox potential E° is 0.52V. To prevent copper ionic migration, the barrier layer 13 in contact with the foil containing copper 14 should have a lower Rodex potential. The barrier layer 13 has a Rodex potential of 0 to −1V, and may use nickel (Ni), tin (Sn), zinc (Zn), chromium (Cr), bismuth (Bi) or cobalt (Co) or combination thereof. The Rodex potential of nickel is −0.25V. The Rodex potential of tin is −0.136V. The Rodex potential of zinc is −0.762V. The barrier layer 13 performs the function of anti-oxidation as well. Table 1 shows the Rodex potentials E° of various materials and the Rodex potential difference compared to copper. The Rodex potentials of these metals are 0 to −1V, and the Rodex potential differences with reference to copper are 0.5 to 1.2V.

TABLE 1

| Materials | E° (V) | Rodex potential difference w/copper (V) |
|---|---|---|
| Ni | −0.25 | 0.65 |
| Sn | −0.136 | 0.536 |
| Zn | −0.762 | 1.162 |
| Cr | −0.74 | 1.14 |
| Bi | −0.2 | 0.6 |
| Co | −0.277 | 0.677 |
| Cu | −0.4 | — |

Figure 2:
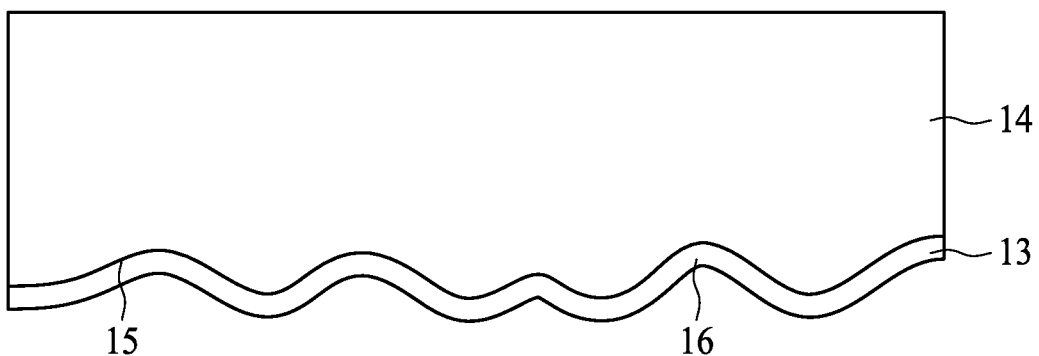
FIG. 2 to FIG. 4 show barrier layers of the thermally conductive board in accordance with various embodiments of the present application.
Figure 3:
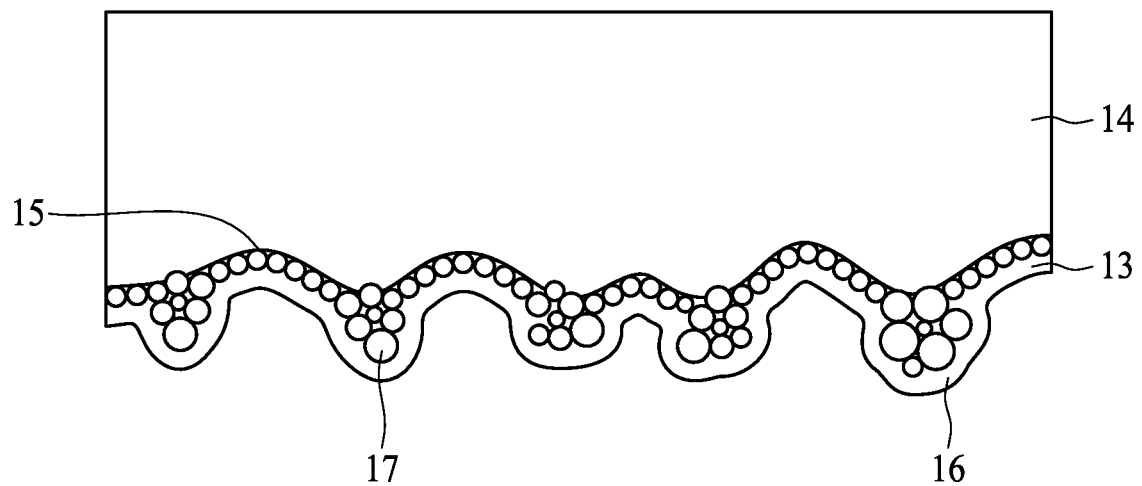
Figure 4:
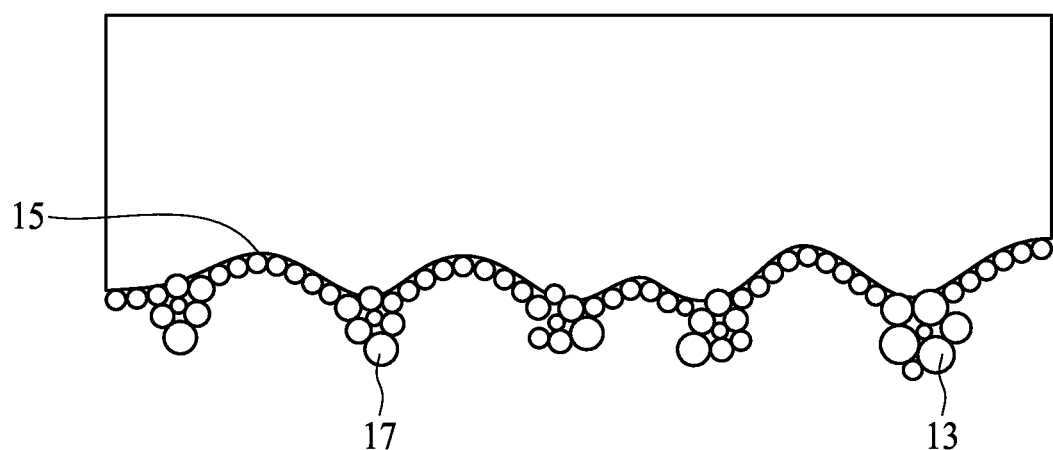

In FIG. 2, the barrier layer 13 is made by depositing or plating a metal layer 16, e.g., a copper layer, on the foil containing copper 14. In this embodiment, the barrier layer 13 consists of the metal layer 16. In another embodiment, before plating a metal layer 16, nodular or uneven metal precipitate is formed on the foil containing copper 14 by electrolytic deposition to form nodules 17. That is, nodularization is proceeded before plating the metal layer 16, as shown in FIG. 3. In this embodiment, the barrier layer 13 is a combination of the nodules 17 and the metal layer 16. In FIG. 4, the barrier layer 13 may contain the nodules 17 only, i.e., excluding the metal layer 16.

Table 2 shows testing conditions and HHBT results of embodiments E1-E4 of the present application and comparative examples C1 and C2 of a thermally conductive board. HHBT undergoes a direct voltage (DC) endurance testing at a temperature of 85° C. and relative humidity (R.H.) of 85% for 1000 hours. DC voltage is 300-3000V. The thickness of the thermally conductive and electrically insulating layer of E1-E4 and C1-C2 is 100 μm, and the roughness Rz of the microrough surface of the foil containing copper is 8 μm. The thermally conductive board of E1-E4 and C2 is shown in FIG. 1, including a barrier layer. However, C1 does not include a barrier layer. E1-E3 use 1 oz foil containing copper with a thickness of 35 μm and a barrier layer including tin, zinc or nickel of a thickness of 1 μm. E4 uses ½ oz foil containing copper with a thickness of 17 μm, and the barrier layer contains nickel with a thickness of 8 μm. C1 and C2 use 1 oz foil containing copper with a thickness of 35 μm. C1 has no barrier layer, whereas C2 has a barrier layer of nickel with a thickness of 0.1 μm.

TABLE 2

| | Foil containing copper | | Barrier layer | | HHBT (85° C./85% RH/1000 hrs) | | | | | | Barrier/copper foil in thickness |
|---|---|---|---|---|---|---|---|---|---|---|---|
| | Size | R_Z (μm) | Material/Thickness | | DC300 V | DC500 V | DC1 kV | DC1.5 kV | DC2 kV | DC3 kV | |
| E1 | 1 oz | 8 | Sn/1 μm | | Pass | Pass | Pass | Fail | — | — | 2.9% |
| E2 | 1 oz | 8 | Zn/1 μm | | Pass | Pass | Pass | Fail | — | — | 2.9% |
| E3 | 1 oz | 8 | Ni/1 μm | | Pass | Pass | Pass | Fail | — | — | 2.9% |
| E4 | 1/2 oz | 8 | Ni/8 μm | | Pass | Pass | Pass | Pass | Pass | Fail | 47.1% |
| C1 | 1 oz | 8 | — | | Pass | Fail | — | — | — | — | — |
| C2 | 1 oz | 8 | Ni/0.1 μm | | Pass | Fail | — | — | — | — | 0.3% |

E1-E4 having a barrier layer of nickel, tin or zinc with a thickness of 1-8 μm can pass DC300V, DC500V and DC 1 kV HHBT. E1-E3 having a barrier layer with a thickness of 1 μm cannot pass DC 1.5 kV HHBT, and E4 having a barrier layer with a thickness of 8 μm can pass DC 2 kV HHBT. Both C1 without a barrier layer and C2 with a barrier layer of only 0.1 μm fail in 500V HHBT. It appears that a thicker barrier layer offers better voltage endurance. The barrier layer having a thickness of 0.5-10 μm, e.g., 2, 4 or 6 μm, can prevent copper ionic migration. The thickness of the barrier layer and the thickness of the foil containing copper are usually considered together. The barrier layer is 1-50% of the foil containing copper in thickness, i.e., a ratio of a barrier layer to the foil containing copper in thickness is 1-50%.

Table 3 shows testing conditions and alternating current (AC) voltage endurance test results, peeling strength and HHBT results of embodiments E5-E10 of the present application and comparative examples C3 and C4 of a thermally conductive board. HHBT undergoes DC endurance testing at a temperature of 85° C., relative humidity (R.H.) of 85% for 1000 hours. The thickness of the thermally conductive and electrically insulating layer of E5-E10 and C3 and C4 is 100 μm. E6, E7, E8, E10, C3 and C4 use 1 oz foil containing copper with a thickness of 35 μm. E5 and E9 use ½ oz foil containing copper with a thickness of 17 μm. Each of E5-E7, E10, C3 and C4 has a barrier layer of nickel with a thickness of 2 μm. In E8 and E9, a barrier layer is formed by nodularing. The barrier layer contains nodules only and does not contain a metal layer. Nodules of the barrier layer have a thickness of 1-8.3 μm. The barrier layer of E10 comprises nodules with a thickness of 1.5 μm and a nickel layer with a thickness of 2 μm, and therefore the barrier layer has a thickness of 3.5 μm. C3 has a foil containing copper with a microrough surface of a roughness Rz of 0.2 μm and C4 has a foil containing copper with a microrough surface of a roughness Rz of 20 μm to identify the influence of roughness Rz of large and small values to peeling strength and voltage endurance.

TABLE 3

| | Foil containing copper | | Barrier layer | | Test result | | | | | | |
|---|---|---|---|---|---|---|---|---|---|---|---|
| | Size | Rz (µm) | Material/ Thickness | Nodular thickness (µm) | Voltage endurance (AC kV) | Voltage endurance ratio | Peeling strength (kg/cm) | HHBT DC 1.5 kV | HHBT DC 2 kV | HHBT DC 3 kV | Rz/Copper foil thickness |
| E5 | 1/2 oz | 3 | Ni/2 µm | — | 5.8 | 93.5% | 1.2 | Pass | Fail | — | 17.6% |
| E6 | 1 oz | 15 | Ni/2 µm | — | 3.5 | 56.5% | 2.4 | Pass | Fail | — | 42.9% |
| E7 | 1 oz | 8 | Ni/2 µm | — | 5.4 | 87.1% | 1.8 | Pass | Fail | — | 22.9% |
| E8 | 1 oz | 8 | — | 1 | 5.3 | 85.5% | 1.7 | Fail | Fail | — | 22.9% |
| E9 | 1/2 oz | 10 | — | 8.3 | 5 | 80.6% | 1.8 | Pass | Pass | Fail | 23.7% |
| E10 | 1 oz | 8 | Ni/2 µm | 1.5 | 4.9 | 79.0% | 1.8 | Pass | Pass | Pass | 22.9% |
| C3 | 1 oz | 0.2 | Ni/2 µm | — | 6.2 | 100.0% | 0.4 | Pass | Fail | — | 0.6% |
| C4 | 1 oz | 20 | Ni/2 µm | — | 2.4 | 38.7% | 2.9 | — | — | — | 57.1% |

E5-E10 have peeling strength greater than or equal to 1 kg/cm, and more specifically, greater than or equal to 1.2 kg/cm. C3 has a small roughness Rz, and the peeling strength is only 0.4 kg/cm which is lower than 0.8 kg/cm of IPC specification. The AC voltage endurance for the thermally conductive and electrically insulating layer is 6.2 kV, ratios of the AC voltage endurance values of E5-E10, C3 and C4 to 6.2 kV are shown in Table 3. Voltage endurance values of E5-E10 are greater than AC 3 kV, and ratios of voltage endurance are greater than 50%. However, C4 has a voltage endurance of AC 2.4 kV, and the ratio of voltage endurance is 38% only. It appears that a large Rz may cause inferior voltage endurance. Preferably, the foil containing copper of a thermally conductive board has a surface roughness Rz of 2-18 µm, e.g., 5, 10 or 15 µm. A value of Rz divided by the thickness of the foil containing copper is 15-50%. If the value is too high, AC endurance voltage is low. If the value is too low, the peeling strength becomes low. In E8-E10, the barrier layer comprises nodules. E8 and E9 use nodules as the barrier layer with nodular thicknesses of 1 µm and 8.3 µm, respectively. E8 passes DC 1 kV HHBT (not shown in Table 3) but fails in DC 1.5 kV HHBT. E9 with thick nodules passes 2 kV HHBT. In an embodiment, the thickness of nodules is 0.5-12 µm. In E10, a nickel layer of a thickness of 2 µm is further formed on the nodules. The thickness of a nodularized barrier layer should include the thickness of nodules. In other words, the barrier layer thickness is the sum of metal layer thickness and nodular thickness. Preferably, the thickness of metal layer and nodular thickness divided by the thickness of the foil containing copper us 1-50%. The foil containing copper of E10 is coated with hydrophobic modifier which may comprise alkyl or fluorine, e.g., alkyl silane. E10 passes DC 3 kV HHBT, and other embodiments E5-E9 pass DC 1.5 kV or DC 2 kV HHBT only. It appears that hydrophobic modifier is favorable to prevent moisture entry to enhance voltage endurance performance in HHBT.

A thicker thermally conductive and electrically insulating layer is favorable to voltage endurance. For example, the thermally conductive and electrically insulating layer with a thickness of 50 µm can withstand DC 100V and with a thickness of 300 µm can withstand DC 600V. The thickness of the thermally conductive and electrically insulating layer is 50-300 µm, e.g., 100 µm or 200 µm.

In the thermally conductive board of the present application, a barrier layer formed between the foil containing copper and the thermally conductive and electrically insulating layer can prevent copper ionic migration effectively to improve HHBT performance. The thermally conductive board capable of passing DC 1 kV or a higher voltage HHBT performs superior voltage endurance and anti-aging characteristic.

The above-described embodiments of the present invention are intended to be illustrative only. Numerous alternative embodiments may be devised by persons skilled in the art without departing from the scope of the following claims.

What is claimed is:

1. A thermally conductive board, comprising
   a metal substrate;
   a foil containing copper;
   a thermally conductive and electrically insulating layer disposed on the metal substrate; and
   a barrier layer laminated between the foil containing copper and the thermally conductive and electrically insulating layer, the barrier layer being in direct contact with the foil containing copper, an interface between the barrier layer and the thermally conductive and electrically insulating layer comprising a microrough surface;
   wherein the barrier layer has a Redox potential between 0 and −1V;
   wherein the microrough surface has a roughness Rz of 2-18 µm.

2. The thermally conductive board of claim 1, wherein Redox potential difference between the barrier layer and the copper is 0.5-1.2V.

3. The thermally conductive board of claim 1, wherein the barrier layer comprises a metal layer, nodules or combination thereof.

4. The thermally conductive board of claim 3, wherein the nodules have a thickness of 0.5-12 µm.

5. The thermally conductive board of claim 1, wherein the barrier layer is 1-50% of the foil containing copper in thickness.

6. The thermally conductive board of claim 1, wherein the barrier layer has a thickness of 0.5-10 µm.

7. The thermally conductive board of claim 1, wherein the barrier layer comprises nickel, tin, zinc, chromium, bismuth, cobalt or combination thereof.

8. The thermally conductive board of claim 1, wherein the roughness Rz of the microrough surface divided by the thickness of the foil containing copper is 15-50%.

9. The thermally conductive board of claim 1, wherein the microrough surface is coated with hydrophobic modifier.

10. The thermally conductive board of claim 1, wherein the thermally conductive board has peeling strength greater than or equal to 1 kg/cm.

11. The thermally conductive board of claim 1, wherein AC voltage endurance of the thermally conductive board is greater than 50% of AC voltage endurance of the thermally conductive and electrically insulating layer.

12. The thermally conductive board of claim 1, wherein the thermally conductive and electrically insulating layer has a thickness of 50-300 μm.

\* \* \* \* \*